United States Patent
Kitazumi

(10) Patent No.: US 11,114,365 B2
(45) Date of Patent: Sep. 7, 2021

(54) ELECTRONIC ELEMENT MOUNTING SUBSTRATE, ELECTRONIC DEVICE, AND ELECTRONIC MODULE

(71) Applicant: KYOCERA Corporation, Kyoto (JP)

(72) Inventor: Noboru Kitazumi, Kyoto (JP)

(73) Assignee: KYOCERA CORPORATION, Kyoto (JP)

(*) Notice: Subject to any disclaimer, the term of this patent is extended or adjusted under 35 U.S.C. 154(b) by 0 days.

(21) Appl. No.: 16/470,606

(22) PCT Filed: Dec. 21, 2017

(86) PCT No.: PCT/JP2017/045979
§ 371 (c)(1),
(2) Date: Jun. 18, 2019

(87) PCT Pub. No.: WO2018/117232
PCT Pub. Date: Jun. 28, 2018

(65) Prior Publication Data
US 2019/0311971 A1  Oct. 10, 2019

(30) Foreign Application Priority Data

Dec. 22, 2016 (JP) .............................. JP2016-249415
Nov. 27, 2017 (JP) .............................. JP2017-226902

(51) Int. Cl.
*H01L 23/373* (2006.01)
*H01L 23/36* (2006.01)
(Continued)

(52) U.S. Cl.
CPC .......... *H01L 23/3735* (2013.01); *H01L 23/12* (2013.01); *H01L 23/15* (2013.01);
(Continued)

(58) Field of Classification Search
CPC ......... H01L 33/64; H01L 23/12; H01L 23/36; H01L 23/3735; H01L 23/15;
(Continued)

(56) References Cited

U.S. PATENT DOCUMENTS

| | | | |
|---|---|---|---|
| 6,649,265 B1* | 11/2003 | Kawamura | C04B 41/009 257/E23.006 |
| 2007/0189011 A1* | 8/2007 | Song | F21V 29/71 362/294 |

(Continued)

FOREIGN PATENT DOCUMENTS

| | | |
|---|---|---|
| JP | 08-191121 A | 7/1996 |
| JP | 2010-538493 A | 12/2010 |

(Continued)

*Primary Examiner* — David Vu
*Assistant Examiner* — Brandon C Fox
(74) *Attorney, Agent, or Firm* — Volpe Koenig

(57) ABSTRACT

An electronic element mounting substrate includes a first substrate including a first main surface and a mounting portion in a rectangular shape for mounting an electronic element, positioned on the first main surface and one end portion of the mounting portion in a longitudinal direction being positioned at an outer edge portion of the first main surface and a second substrate positioned on a second main surface opposite to the first main surface, formed of a carbon material, and including a third main surface facing the second main surface and a fourth main surface opposite to the third main surface. A thermal conduction of the mounting portion in a direction perpendicular to in a longitudinal direction is greater than a thermal conduction of the mounting portion in the longitudinal direction, in the third main surface or the fourth main surface, in plan view.

6 Claims, 13 Drawing Sheets

(51) Int. Cl.
*H01L 23/15* (2006.01)
*H01L 23/498* (2006.01)
*H01L 31/024* (2014.01)
*H01S 5/02* (2006.01)
*H01S 5/024* (2006.01)
*H05K 1/02* (2006.01)
*H01L 23/12* (2006.01)
*H01S 5/022* (2021.01)
*H01L 33/48* (2010.01)
*H01S 5/0237* (2021.01)

(52) U.S. Cl.
CPC ........ *H01L 23/36* (2013.01); *H01L 23/49833* (2013.01); *H01L 31/024* (2013.01); *H01L 33/48* (2013.01); *H01S 5/022* (2013.01); *H01S 5/0206* (2013.01); *H01S 5/02469* (2013.01); *H05K 1/02* (2013.01); *H01S 5/0237* (2021.01)

(58) Field of Classification Search
CPC . H01L 23/49833; H01L 31/024; H01L 33/48; H01S 5/0206; H01S 5/02469
USPC ........................................................ 257/712
See application file for complete search history.

(56) References Cited

U.S. PATENT DOCUMENTS

| | | | |
|---|---|---|---|
| 2008/0019097 A1* | 1/2008 | Zhang | H01L 23/3733 361/704 |
| 2011/0014417 A1 | 1/2011 | Lemak et al. | |
| 2011/0303399 A1 | 12/2011 | Sakimichi et al. | |
| 2012/0152510 A1* | 6/2012 | Noda | H01L 23/34 165/185 |
| 2012/0298408 A1* | 11/2012 | Nagatomo | H01L 23/142 174/260 |
| 2015/0096719 A1* | 4/2015 | Moskaitis | H01L 23/373 165/80.4 |
| 2015/0253089 A1 | 9/2015 | Fan et al. | |
| 2015/0382509 A1* | 12/2015 | Nagata | H01L 23/3733 361/710 |

FOREIGN PATENT DOCUMENTS

| | | |
|---|---|---|
| JP | 2011-258755 A | 12/2011 |
| JP | 2012-238733 A | 12/2012 |
| JP | 2013-175508 A | 9/2013 |
| JP | 2016-149431 A | 8/2016 |
| WO | 2009/032310 A1 | 3/2009 |
| WO | 2011/008467 A1 | 1/2011 |
| WO | 2014/052282 A1 | 4/2014 |

* cited by examiner

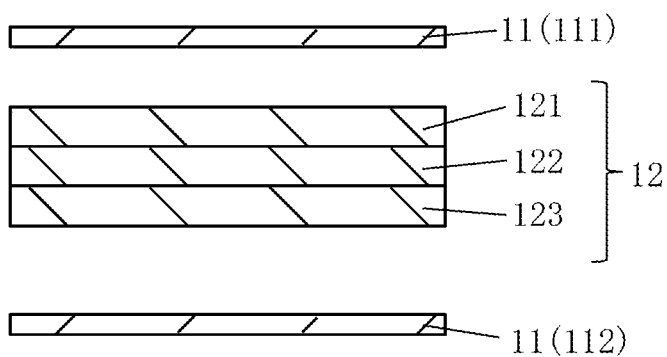
FIG. 13A
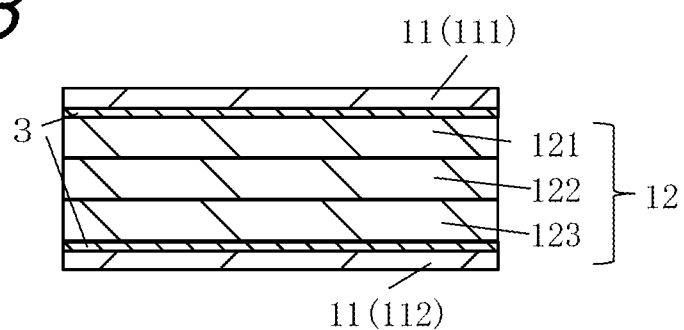
FIG. 13B
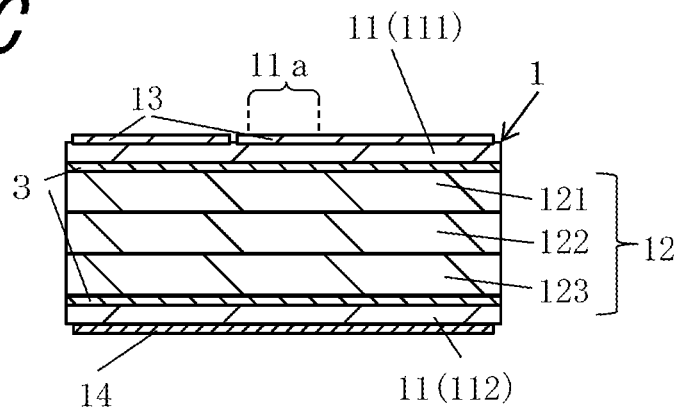
FIG. 13C
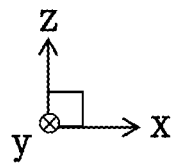

ELECTRONIC ELEMENT MOUNTING SUBSTRATE, ELECTRONIC DEVICE, AND ELECTRONIC MODULE

TECHNICAL FIELD

The present invention relates to an electronic element mounting substrate, an electronic device, and an electronic module.

BACKGROUND ART

In the related art, an electronic element mounting substrate includes an insulating substrate having a first main surface, a second main surface, and a side surface, and a mounting portion for an electronic element positioned on the first main surface of the insulating substrate and a wiring layer. After an electronic element is mounted on the mounting portion for an electronic element, the electronic element mounting substrate is mounted on an electronic element housing package, thereby constituting an electronic device (see Japanese Unexamined Patent Application Publication No. 2013-175508).

SUMMARY OF INVENTION

An electronic element mounting substrate of the present disclosure includes a first substrate including a first main surface and a mounting portion in a rectangular shape for mounting an electronic element, positioned on the first main surface, one end portion of the mounting portion in a longitudinal direction being positioned at an outer edge portion of the first main surface and a second substrate positioned on a second main surface opposite to the first main surface, formed of a carbon material, and including a third main surface facing the second main surface and a fourth main surface opposite to the third main surface, in which a thermal conduction of the mounting portion in a direction perpendicular to the longitudinal direction is greater than a thermal conduction of the mounting portion in the longitudinal direction, in the third main surface or the fourth main surface, in plan view.

An electronic device of the present disclosure includes the electronic element mounting substrate having the above configuration, an electronic element mounted on the mounting portion of the electronic element mounting substrate, and a wiring board or an electronic element housing package on which the electronic element mounting substrate is mounted.

An electronic module of the present disclosure includes the electronic device having the above configuration and a module substrate connected with the electronic device.

BRIEF DESCRIPTION OF DRAWINGS

FIGS. 13A to 13C illustrates sectional views illustrating a method for manufacturing the electronic element mounting substrate of the third embodiment.

DESCRIPTION OF EMBODIMENTS

Figure 1A:
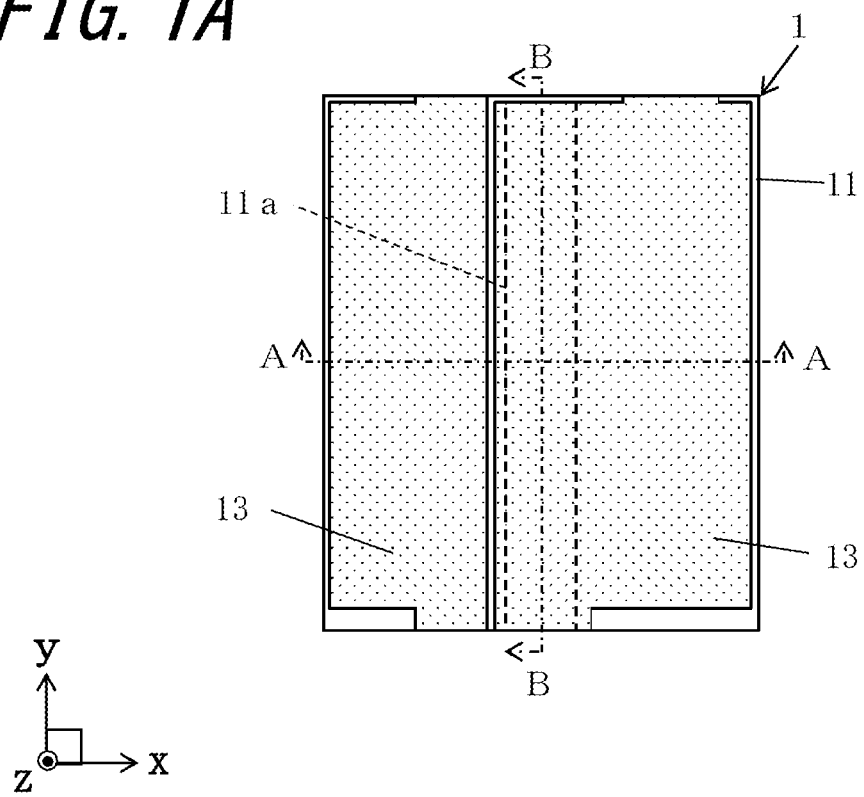
FIG. 1A is a top view illustrating an electronic element mounting substrate according to a first embodiment and FIG. 1B is a bottom view of FIG. 1A.
Figure 1B:
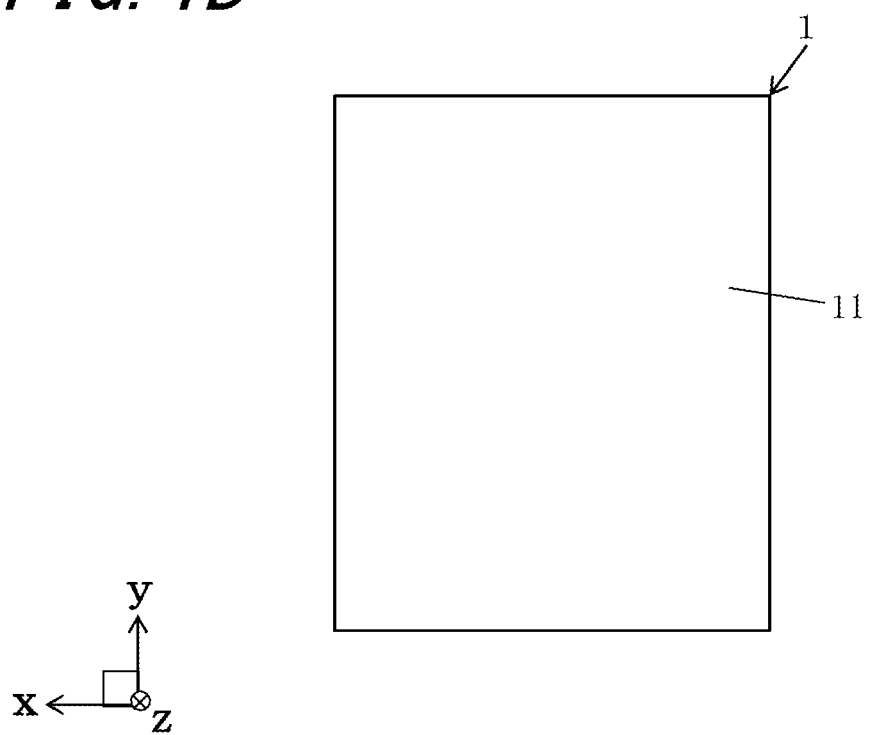

Several exemplary embodiments of the present disclosure will be described with reference to accompanying drawings.

First Embodiment

An electronic element mounting substrate 1 in a first embodiment includes a first substrate 11 and a second substrate 12 as in examples illustrated in FIGS. 1A to 4B. An electronic device includes the electronic element mounting substrate 1, an electronic element 2 mounted on a mounting portion 11a of the electronic element mounting substrate 1, and a wiring board on which the electronic element mounting substrate 1 is mounted. For example, the electronic device is connected, with a bonding material, to a connection pad on a module substrate which configures an electronic module.

The electronic element mounting substrate 1 in the present embodiment includes: the first substrate 11 including a first main surface and a mounting portion 11a in a rectangular shape for mounting the rectangular electronic element 2, positioned on the first main surface, one end portion of the mounting portion 11a in a longitudinal direction being positioned at an outer edge portion of the first main surface; and the second substrate 12 disposed on a second main surface opposite to the first main surface, formed of a carbon material, and having a third main surface facing the second main surface and a fourth main surface opposite to the third main surface. A thermal conduction of the third main surface or the fourth main surface in a direction perpendicular to the longitudinal direction of the mounting portion 11a is greater than a thermal conduction of the mounting portion in the longitudinal direction, in plan view. In FIGS. 1A to 4B, the electronic element 2 is mounted on a xy plane in a virtual xyz space. In FIGS. 1A to 4B, an upward direction is a positive direction of a virtual z axis. The distinction between the upper and lower sides in the following description is for convenience, and does not limit the upper and lower sides when the electronic element mounting substrate 1 or the like is actually used.

A metal layer 13 is indicated by hatching in the example illustrated in FIG. 1A.

The first substrate 11 includes a first main surface (an upper surface in FIGS. 1A to 3B) and a second main surface (a lower surface in FIGS. 1A to 3B). The first substrate 11 includes a single insulating layer or a plurality of insulating layers and has a square plate shape having two pairs of facing sides (four sides) with respect to each of the first main surface and the second main surface in plan view. The first substrate 11 functions as a support for supporting the electronic element 2 in a rectangular shape, and the electronic element 2 is adhered to and fixed on the mounting portion 11a in a rectangular shape positioned on the first main surface of the first substrate 11 via a bonding member 3 such as Au—Sn.

As the first substrate 11, for example, ceramics such as an aluminum oxide sintered body (alumina ceramic), an aluminum nitride sintered body, a mullite sintered body, or a glass ceramic sintered body can be used. If the first substrate 11 is, for example, the aluminum nitride sintered body, appropriate organic binders, solvents, and the like are added to and mixed with raw material powders such as aluminum nitride (AlN), erbium oxide ($Er_2O_3$), yttrium oxide ($Y_2O_3$) and the like to prepare a slurry. The slurry is formed into a sheet by adopting a conventionally well-known doctor blade method, calendar roll method, or the like to produce a ceramic green sheet. As necessary, a plurality of ceramic green sheets is laminated and fired at a high temperature (about 1800° C.), thereby manufacturing the first substrate 11 of a single insulating layer or a plurality of insulating layers.

The second substrate 12 includes a third main surface (an upper surface in FIGS. 1A to 3B) and a fourth main surface (a lower surface in FIGS. 1A to 3B). The second substrate 12 has a rectangular plate shape having two pairs of facing sides (four sides) with respect to each of the third main surface and the fourth main surface in plan view.

The second substrate 12 is formed of, for example, a carbon material, and is formed as a structure that graphene in which six-membered rings are connected by a covalent coupling is stacked. Each surface is coupled by van der Waals force in the material.

As the first substrate 11, an aluminum nitride sintered body with good thermal conductivity is suitably used. In the first substrate 11 and the second substrate 12, the second main surface of the first substrate 11 and the third main surface of the second substrate 12 are bonded, for example, with a bonding material of an active brazing material such as a TiCuAg alloy. The bonding material is disposed with a thickness of about 10 μm between the first substrate 11 and the second substrate 12.

The first substrate 11 and the second substrate 12 each have a square shape in plan view. By bonding the square shaped first substrate 11 and the square shaped second substrate 12, a square shaped composite substrate is formed. The square shape is a quadrangle such as a square or a rectangular shape. In the example illustrated in FIGS. 1A to 3B, the first substrate 11 and the second substrate 12 have a rectangular shape, and a rectangular composite substrate is formed.

A substrate thickness T1 of the first substrate 11 is, for example, about 50 μm to 500 μm, and the substrate thickness T2 of the second substrate 12 is, for example, about 100 μm to 2000 μm. When T2>T1, the first substrate 11 and the second substrate 12 can appropriately dissipate a heat of the first substrate 11 to the second substrate 12.

Figure 2:
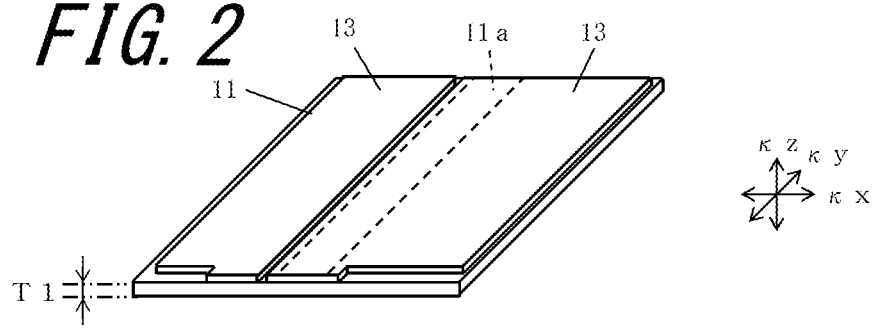
FIG. 2 is an exploded perspective view of a first substrate and a second substrate of the electronic element mounting substrate illustrated in FIGS. 1A and 1B.
Figure 2:
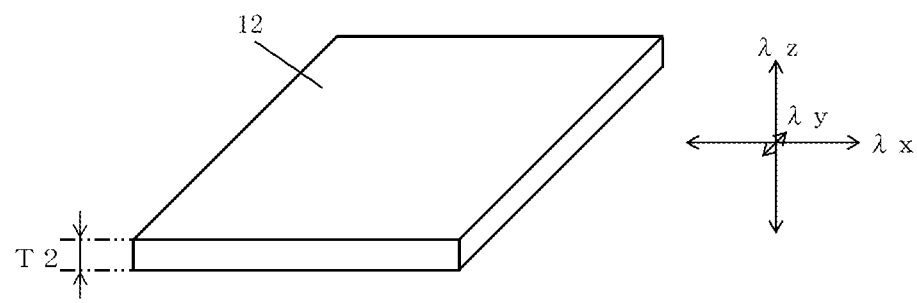
Figure 2:
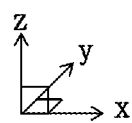
Figure 3A:
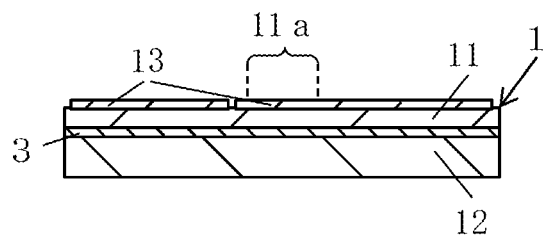
FIG. 3A is a longitudinal sectional view taken along line A-A of the electronic element mounting substrate illustrated in FIG. 1A
Figure 3A:
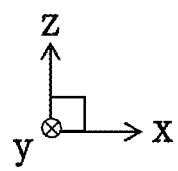
Figure 3B:
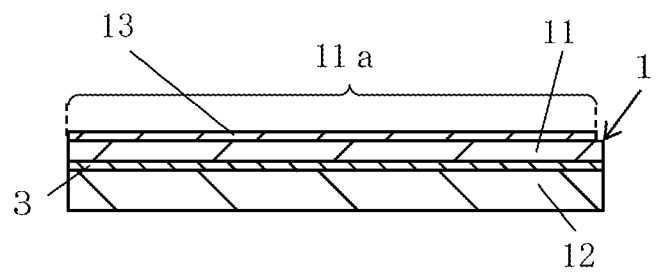
FIG. 3B is a longitudinal sectional view taken along line B-B of the electronic element mounting substrate illustrated in FIG. 1A.
Figure 3B:
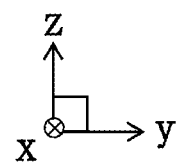
Figure 4A:
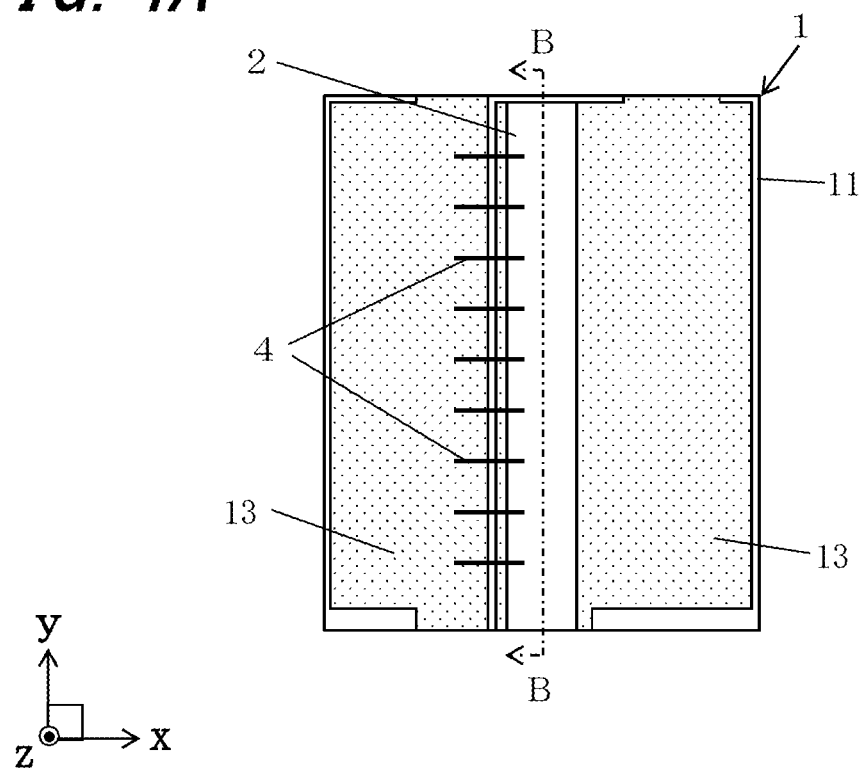
FIG. 4A is a top view illustrating a state where an electronic element is mounted on the electronic element mounting substrate illustrated in FIG. 1A
Figure 4B:
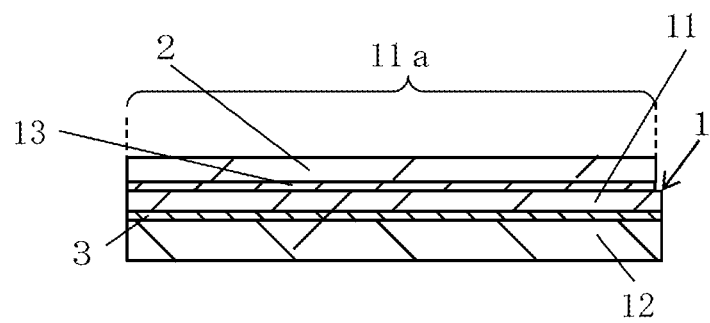
FIG. 4B is a longitudinal sectional view taken along line B-B of FIG. 4A.
Figure 4B:
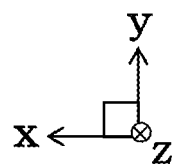

A thermal conductivity κ of the first substrate 11 is substantially constant in an X direction and a Y direction in a plane direction as in the example illustrated in FIG. 2, and a thermal conductivity κ in a Z direction of the first substrate 11 in the thickness direction is also equal to that in the X direction and the Y direction in the plane direction (κx≈κy≈κz). For example, when an aluminum nitride sintered body is used as the first substrate 11, a substrate having the thermal conductivity κ of about 100 to 200 W/m·K is used as the first substrate 11.

A thermal conductivity λ of the second substrate 12 is different in magnitude between the X direction and the Y direction in the plane direction. The relationship between the thermal conductivities λx, λy, and λz in respective directions of the second substrate 12 illustrated in FIG. 2 is "thermal conductivity λx≈thermal conductivity λz>>thermal conductivity λy". The thermal conductivity λ of the second substrate 12 is equal in the X direction in the plane direction and in the Z direction in the thickness direction. For example, the thermal conductivity λx and the thermal conductivity λz of the second substrate 12 are about 1000 W/m·K, and the thermal conductivity λy of the second substrate 12 is about 4 W/m·K.

The metal layer 13 is positioned on the first main surface of the first substrate 11. The metal layer 13 is used as the mounting portion 11a for the electronic element 11 or a connection portion for a connection member 4 such as a bonding wire, and is used for electrically connecting the electronic element 2 and a wiring conductor of the wiring board.

The metal layer 13 includes a thin film layer and a plating layer. The thin film layer has, for example, an adhesion metal layer and a barrier layer. The adhesion metal layer configuring the thin film layer is disposed on the first main surface of the first substrate 11. The adhesion metal layer is formed of, for example, tantalum nitride, nickel-chromium, nickel-chromium-silicon, tungsten-silicon, molybdenum-silicon, tungsten, molybdenum, titanium, chromium or the like, and is deposited on the first main surface of the first substrate 11 by adopting a thin film forming technique such as a vapor deposition method, an ion plating method, or a sputtering method. For example, when forming the layer using a vacuum evaporation method, the first substrate 11 is placed in a deposition chamber of a vacuum deposition apparatus, and a metal piece serving as an adhesion metal layer is placed as a deposition source in the deposition chamber, thereafter, the deposition chamber is in a vacuum state (pressure of $10^{-2}$ Pa or less), the metal piece disposed as the deposition source is heated and vapor-deposited, and the molecules of the vapor-deposited metal piece are adhered to the first substrate 11 to form a thin film metal layer to be an adhesion metal layer. Then, a resist pattern is formed on the first substrate 11 on which the thin film metal layer is formed by photolithography, and an excessive thin film metal layer is removed by etching to form the adhesion metal layer. The upper surface of the adhesion metal layer is covered with a barrier layer, and the barrier layer has good bonding properties and wettability with the adhesion metal layer and the plating layer and functions to firmly bond the adhesion metal layer and the plating layer and to prevent mutual diffusion between the adhesion metal layer and the plating layer. The barrier layer is formed of, for example, nickel-chromium, platinum, palladium, nickel, cobalt or the like, and is deposited on the surface of the adhesion metal layer by a thin film formation technique such as vapor deposition, ion plating, or sputtering.

The thickness of the adhesion metal layer is preferably about 0.01 to 0.5 µm. If the thickness is less than 0.01 µm, it may be difficult to cause the adhesion metal layer to firmly adhere onto the first substrate 11. If the thickness exceeds 0.5 µm, peeling of the adhesion metal layer is likely to occur due to internal stress during film formation of the adhesion metal layer. The thickness of the barrier layer may be about 0.05 to 1 µm. If the thickness is less than 0.05 µm, defects such as pinholes may occur and it may be difficult to function as a barrier layer. If the thickness exceeds 1 µm, peeling of the barrier layer is likely to occur due to internal stress during film formation.

The plating layer is deposited on the exposed surface of the thin film layer by electrolytic plating or electroless plating. The plating layer is formed of metal such as nickel, copper, gold or silver with good corrosion resistance and connectivity with the connection member, and, as the plating layer, for example, a nickel plating layer having a thickness of about 0.5 to 5 µm and a gold plating layer having a thickness of about 0.1 to 3 µm are sequentially deposited. In this manner, the corrosion of the metal layer 13 can be effectively suppressed, and bonding between the metal layer 13 and the wiring conductor formed on the wiring board can be strengthened.

A metal layer such as copper (Cu) or gold (Au) may be disposed on the barrier layer so that the plating layer is appropriately formed. Such a metal layer is formed by the same method as the thin film layer.

The first main surface of the first substrate 11 may be planarized by surface processing such as polishing. For example, after the first main surface of the first substrate 11 is planarized, the first substrate 11 and the second substrate 12 may be bonded, or after the first substrate 11 and the second substrate 12 are bonded, the first main surface of the first substrate 11 may be planarized. In this manner, the metal layer 13 can be appropriately formed on the first main surface of the first substrate 11, and the heat of the first substrate 11 can be appropriately dissipated to the second substrate 12.

The second main surface of the first substrate 11 may be planarized by surface processing such as polishing. In this manner, the second main surface of the first substrate 11 and the third main surface of the second substrate 12 can be adhered to each other, and the heat of the first substrate 11 can be appropriately dissipated to the second substrate 12.

The first main surface of the first substrate 11 and the second main surface of the first substrate 11 may be planarized in advance by surface processing such as polishing before bonding the first substrate 11 and the second substrate 12.

The rectangular electronic element 2 is mounted on the mounting portion 11a positioned on the first main surface of the electronic element mounting substrate 1, and the electronic element mounting substrate 1 is mounted on the wiring board or an electronic element housing package to thereby manufacture an electronic device. The electronic element 2 mounted on the electronic element mounting substrate 1 is, for example, a light emitting element such as a laser diode (LD) or a light sensing element such as a photo diode (PD). For example, after the electronic element 2 is fixed on the mounting portion 11a of one metal layer 13 with a bonding material such as Au—Sn, an electrode of the electronic element 2 and another metal layer 13 are electrically connected to each other via the connection member 4 such as a bonding wire, and thus the electronic element 2 is mounted on the electronic element mounting substrate 1. The electrode of the electronic element 2 and the other metal layer are electrically connected by a plurality of connection members 4 in the example illustrated in FIGS. 4A and 4B. Similarly to the first substrate 11, for example, the wiring board or the electronic element housing package on which the electronic element mounting substrate 1 is mounted uses an insulating substrate such as a ceramic substrate, and a wiring conductor is disposed on the surface thereof. The metal layer 13 of the electronic element mounting substrate 1 and the wiring conductor of the wiring board or the electronic element housing package are electrically connected to each other.

According to the present embodiment, since the electronic device includes the electronic element mounting substrate 1 having the above-described configuration, the electronic element 2 mounted on the mounting portion 11a of the electronic element mounting substrate 1, and the wiring board or the electronic element housing package on which the electronic element mounting substrate 1 is mounted, the electronic device with good long-term reliability can be achieved.

The electronic device of the present embodiment is connected to the wiring conductor and the connection pad of the module substrate via a bonding material 6 such as solder to form an electronic module. In this manner, the electronic element 2 and the connection pad of the module substrate are electrically connected to each other.

According to the present embodiment, since the electronic module includes the electronic device having the above-described configuration and the module substrate to which the electronic device is connected, the electronic module with good long-term reliability can be achieved.

According to the electronic element mounting substrate 1 of the present embodiment, the substrate includes: the first substrate 11 including the first main surface and a mounting portion in a rectangular shape for mounting the electronic element 2, positioned on the first main surface, one end portion of the mounting portion in a longitudinal direction being positioned at an outer edge portion of the first main surface; and the second substrate 12 disposed on a second main surface opposite to the first main surface, formed of a carbon material, and having a third main surface facing the second main surface and a fourth main surface opposite to the third main surface, in which a thermal conduction of the mounting portion in a direction perpendicular the longitudinal direction is greater than a thermal conduction of the mounting portion in the longitudinal direction, in the third main surface or the fourth main surface, in plan view. Therefore, for example, when the electronic device operates, heat generated from the electronic element 2 is easily dissipated in a direction different from the longitudinal direction of the electronic element 2, expansion of the electronic element 2 due to the heat generated from the electronic element 2, particularly, the expansion of the electronic element 2 in the longitudinal direction is reduced, and by suppressing a positional deviation of the electronic element 2 or a distortion of the electronic element mounting substrate 1, light can be appropriately emitted.

In particular, when an optical element such as an LD is mounted as the electronic element 2, the electronic element mounting substrate 1 is realized as the substrate for an optical device capable of accurately emitting light.

In particular, when the optical element such as a high-output LD is mounted as the electronic element 2, the electronic element mounting substrate 1 for an optical device capable of accurately emitting light is realized.

As in the example illustrated in FIGS. 1A to 4B, if the electronic element mounting substrate 1 has a rectangular shape in which a long side corresponding to the longitudinal direction of the electronic element 2 extends in plan view along the rectangular electronic element 2, the width of the electronic element mounting substrate 1 in the direction perpendicular to the longitudinal direction of the electronic element 2 is shortened, and heat transferred in directions different from the longitudinal direction of the electronic element 2 can be easily dissipated to the outside.

The electronic element mounting substrate 1 in the present embodiment can be suitably used in a thin and high-power electronic device and the reliability of the electronic element mounting substrate 1 can be improved. For example, when the optical element such as an LD is mounted as the electronic element 2, the electronic element mounting substrate 1 can be suitably used as the substrate for a thin optical device with good directivity.

In plan view, the second substrate 12 has the first side surface on the side where the one end portion is positioned and the first side surface has a thermal conduction of the second substrate 12 in the thickness direction which is greater than a thermal conduction of the second substrate 12 in a direction perpendicular to the thickness direction of the second substrate 12. Thus, for example, when the electronic device operates, heat generated from the electronic element 2 is easily dissipated to the fourth main surface side in the thickness direction via the first side surface, expansion of the electronic element 2 due to the heat generated from the electronic element 2, particularly, the expansion of the electronic element 2 in the longitudinal direction is further reduced, positional deviation of the electronic element 2 or distortion of the electronic element mounting substrate 1 is suppressed, and light can be appropriately emitted easily.

The second substrate 12 has a second side surface opposite to the first side surface, and the second side surface has a thermal conduction of the second substrate 12 in the thickness direction which is greater than a thermal conduction of the second substrate 12 in a direction perpendicular to the thickness direction of the second substrate 12. Thus, for example, when the electronic device operates, heat generated from the electronic element 2 is easily dissipated to the fourth main surface side in the thickness direction via the second side surface, expansion of the electronic element 2 due to the heat generated from the electronic element 2, particularly, the expansion of the electronic element 2 in the longitudinal direction is further reduced, positional deviation of the electronic element 2 or distortion of the electronic element mounting substrate 1 is suppressed, and light can be appropriately emitted easily. Furthermore, as described above, also in the first side surface, if the thermal conduction of the second substrate 12 in the thickness direction is greater than that in the direction perpendicular to the thickness direction of the second substrate 12, for example, when the electronic device operates, heat generated from the electronic element 2 can be effectively dissipated to the fourth main surface side in the thickness direction via the first side surface and the second side surface, expansion of the electronic element 2 due to the heat generated from the electronic element 2, particularly, the expansion of the electronic element 2 in the longitudinal direction is further reduced, positional deviation of the electronic element 2 or distortion of the electronic element mounting substrate 1 is suppressed, and light can be appropriately emitted easily.

The electronic element mounting substrate 1 according to the first embodiment can be manufactured by, for example, the following manufacturing method.

Figure 5A:
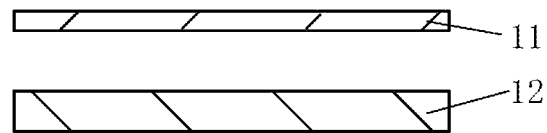
FIGS. 5A to 5C illustrate sectional views illustrating a method for manufacturing the electronic element mounting substrate of the first embodiment.
Figure 5B:
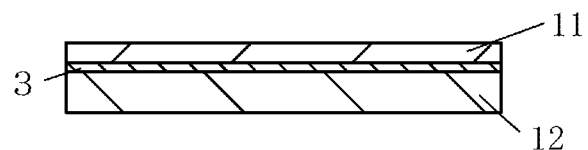
Figure 5C:
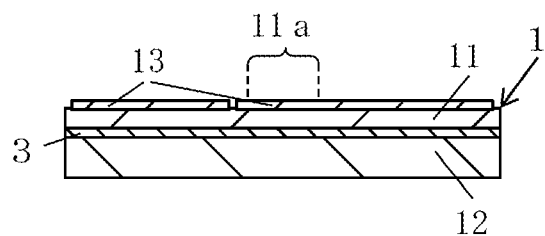
Figure 5C:
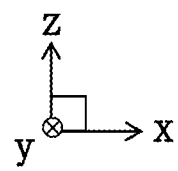
Figure 6A:
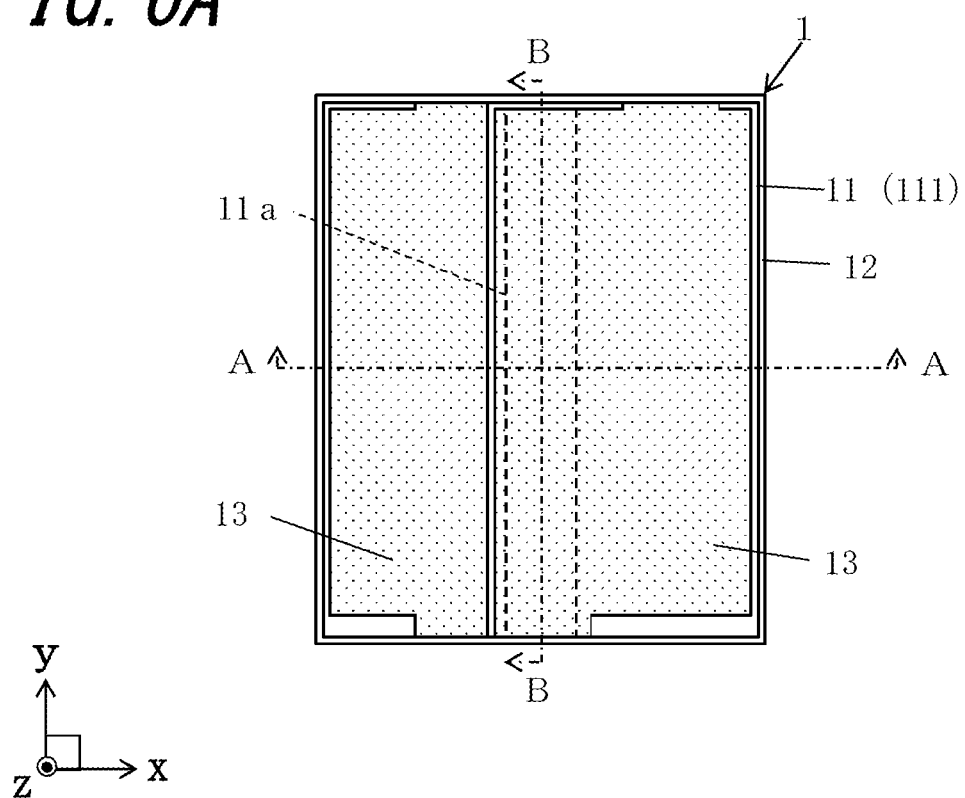
FIG. 6A is a top view illustrating an electronic element mounting substrate according to a second embodiment and FIG. 6B is a bottom view of FIG. 6A.
Figure 6B:
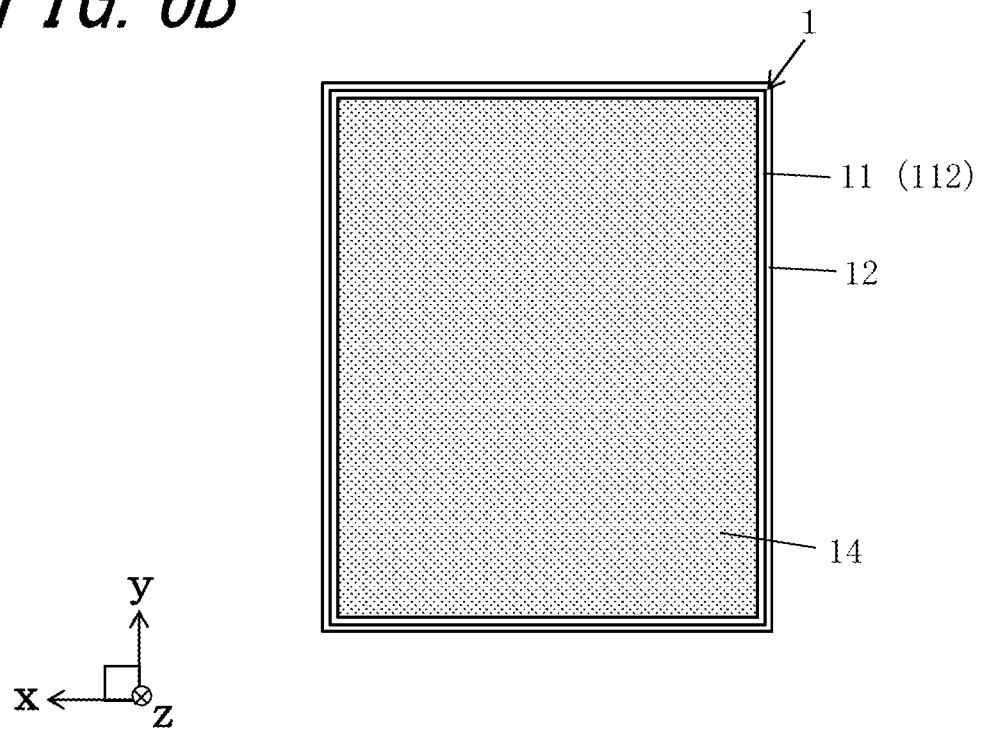

First, as illustrated in FIG. 5A, the first substrate 11 and the second substrate 12 are prepared. The flatness of each of the second main surface of the first substrate 11 and the third main surface of the second substrate 12 may be 10 μm or less. Next, as in the example illustrated in FIG. 5B, the second main surface of the first substrate 11 and the third main surface of the second substrate 12 are bonded by a bonding material 3 such as an active brazing material of a TiCuAg alloy, thereby forming the composite substrate. The thickness of the bonding material 3 is about 10 μm. Next, the metal layer 13 is formed on the first main surface of the first substrate 11. The metal layer 13 is formed so that the X direction (thermal conductivity $\lambda x$>>thermal conductivity $\lambda y$) of the second substrate 12 in the composite substrate is perpendicular to the longitudinal direction of the mounting portion 11$a$, thereby forming the electronic element mounting substrate 1 as in the example illustrated in FIG. 5C.

When forming the thin film layer to be the metal layer 13 on the first main surface of the first substrate 11 and forming the plating layer on the thin film layer, if a protective film such as a resin, ceramic, or metal film is disposed in advance on the exposed surface of the second substrate 12, the second substrate 12 formed of a carbon material is not exposed when the electronic element mounting substrate 1 is manufactured. Therefore, it is possible to reduce deterioration due to chemicals or the like.

The thermal conductivity of the electronic element mounting substrate 1 of the present invention can be measured by, for example, an analysis method such as a laser flash method. When the thermal conductivity of the second substrate 12 is measured, the bonding material 3 for bonding the first substrate and the second substrate 12 is removed, and the thermal conductivity of the second substrate 12 can be measured by the analysis method such as a laser flash method.

Second Embodiment

Next, an electronic element mounting substrate according to a second embodiment will be described with reference to FIGS. 6A to 9C.

The electronic device according to the second embodiment is different from the electronic device of the above embodiment in that the first substrate 11 (111, 112) is bonded to the third main surface and the fourth main surface of the second substrate 12, respectively, that is, the second substrate 12 is stacked between the two first substrates 11 (111, 112). In addition, a bonding layer 14 is positioned on the first main surface of the first substrate 112 (the lower surface of the electronic element mounting substrate 1 in FIGS. 6A to 9C). The metal layer 13 and the bonding layer 14 are indicated by hatching in the example illustrated in FIGS. 6A and 6B.

According to the electronic element mounting substrate 1 in the second embodiment, similarly to the electronic element mounting substrate 1 of the above embodiment, heat dissipation is facilitated in directions different from the expansion direction of the electronic element in the longitudinal direction, the expansion of the electronic element 2 in the longitudinal direction is reduced, the positional deviation of the electronic element 2 or distortion of the electronic element mounting substrate 1 is suppressed, and light can be appropriately emitted easily.

Since the second substrate 12 is stacked between the two first substrates 11, the distortion of the electronic element mounting substrate 1 due to the difference in thermal expansion between the first substrate 11 and the second substrate 12 is suppressed, positional deviation of the electronic element 2 or distortion of the electronic element mounting substrate 1 is suppressed, and the light can be appropriately emitted easily.

In the electronic element mounting substrate 1 of the second embodiment, the second main surface of the first substrate 111 and the third main surface of the second substrate 12, and the second main surface of the first substrate 112 and the fourth main surface of the second substrate 12 are bonded by the bonding material 3 such as an active brazing material formed of a TiCuAg alloy.

Similarly to the first embodiment, also in the electronic element mounting substrate 1 of the second embodiment, the first substrate 11 (111, 112) and the second substrate 12 each have a square shape in plan view. By bonding the square shaped first substrate 11 and the square shaped second substrate 12, a square shaped composite substrate is formed. The square shape is a quadrangle such as a square or a rectangular shape. In the example illustrated in FIGS. 6A to 9C, the first substrate 11 (111, 112) and the second substrate 12 have a rectangular shape, and a rectangular composite substrate is formed.

Similarly to the electronic element mounting substrate 1 of the first embodiment, the substrate thickness T1 (T11, T12) of the first substrate 11 (111, 112) is, for example, about 50 μm to 500 μm, and similarly to the electronic element mounting substrate 1 of the first embodiment, the substrate thickness T2 of the second substrate 12 is, for example, about 100 μm to 2000 μm. When T2>T1 (T11), the first substrate 11 (111, 112) and the second substrate 12 can appropriately dissipate a heat of the first substrate 111 to the second substrate 12.

Figure 7:
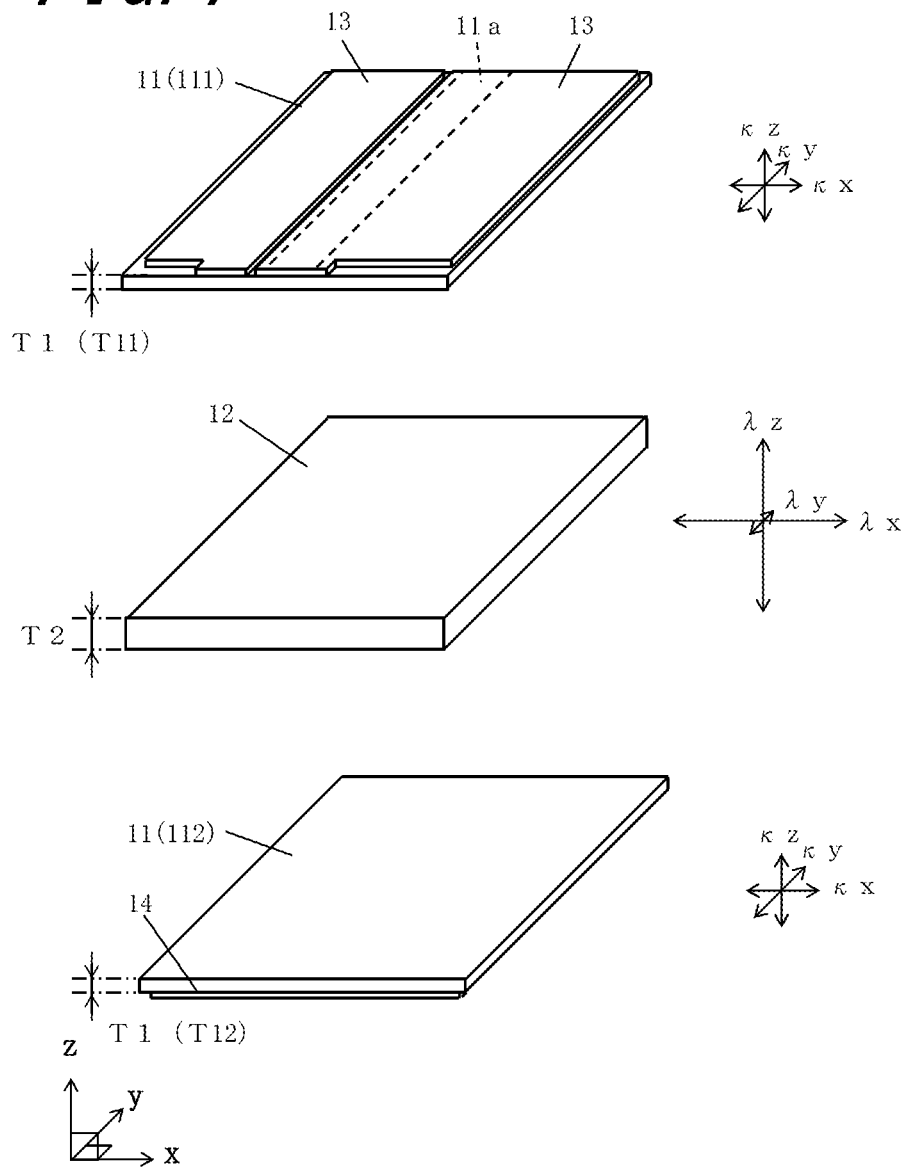
FIG. 7 is an exploded perspective view of a first substrate and a second substrate of the electronic element mounting substrate illustrated in FIGS. 6A and 6B.
Figure 8A:
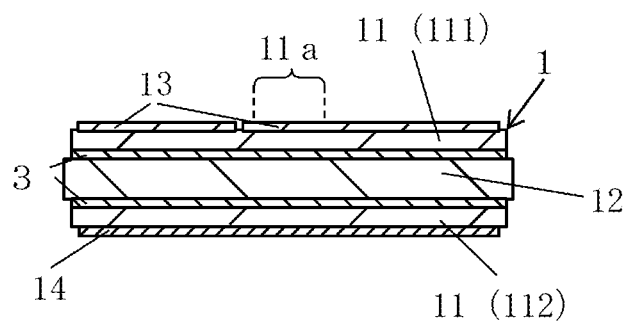
FIG. 8A is a longitudinal sectional view taken along line A-A of the electronic element mounting substrate illustrated in FIG. 6A
Figure 8A:
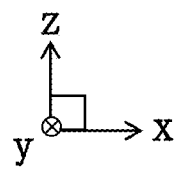
Figure 8B:
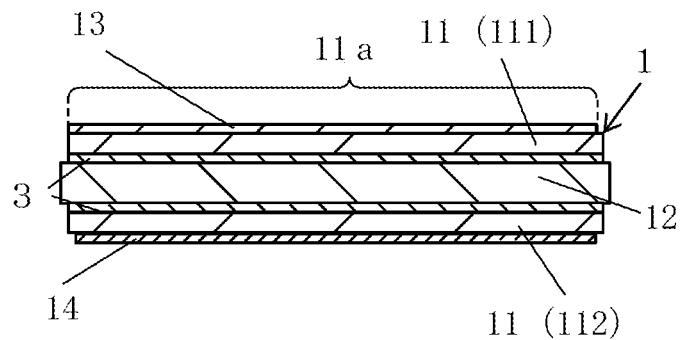
FIG. 8B is a longitudinal sectional view taken along line B-B of the electronic element mounting substrate illustrated in FIG. 6A.
Figure 8B:
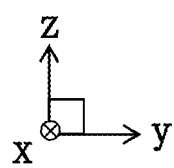

Similarly to the electronic element mounting substrate 1 of the first embodiment, a thermal conductivity κ of the first substrate 11 (111, 112) is substantially constant in an X direction and a Y direction in a plane direction of each substrate as in the example illustrated in FIG. 7, and a thermal conductivity κ in a Z direction of the first substrate 11 (111, 112) in the thickness direction is also equal to that in the X direction and the Y direction in the plane direction (kx≈ky≈kz). For example, when an aluminum nitride sintered body is used as the first substrate 11 (111, 112), a substrate having the thermal conductivity κ of about 100 to 200 W/m·K is used as the first substrate 11 (111, 112).

The thermal conductivity λ of the second substrate 12 is different in magnitude between the X direction and the Y direction in the plane direction. The relationship between the thermal conductivities λx, λy, and λz in respective directions of the second substrate 12 illustrated in FIG. 7 is "thermal conductivity λx≈thermal conductivity λz>>thermal conductivity λy". The thermal conductivity λ of the second substrate 12 is equal in the X direction in the plane direction and in the Z direction in the thickness direction and is different in the Y direction in the plane direction. For example, the thermal conductivity λx and the thermal conductivity λz of the second substrate 12 are about 1000 W/m·K, and the thermal conductivity λy of the second substrate 12 is about 4 W/m·K.

The two first substrates 11 (111, 112) bonded to the third main surface and the fourth main surface of the second substrate 12 may be the substrates formed of the same material. For example, when the first substrate 111 is an aluminum nitride sintered body having a thermal conductivity of 150 W/m·K, the first substrate 112 may be an aluminum nitride sintered body having a thermal conductivity of 150 W/m·K. By setting the material of the first substrate 111 bonded to the third main surface of the second substrate 12 and the material of the first substrate 112 bonded to the fourth main surface of the second substrate 12 to same as each other, distortion of the electronic element mounting substrate 1 can be appropriately reduced.

The two first substrates 11 (111, 112) bonded to the third main surface and the fourth main surface of the second substrate 12 may have a difference in thickness of 10% or less (0.9T12≤T11≤1.1T12), or may be substrates having the same thickness (T11=T12). For example, when the thickness of the first substrate 111 is 100 μm, the thickness of the first substrate 112 may be 100 μm or may be 90 μm to 110 μm. By setting the thickness of the first substrate 111 bonded to the third main surface of the second substrate 12 and the thickness of the first substrate 112 bonded to the fourth main surface of the second substrate 12 to same as each other, distortion of the electronic element mounting substrate 1 can be appropriately reduced.

As in the example illustrated in FIGS. 6A to 9C, in the first substrate 112 bonded to the fourth main surface, the bonding layer may be positioned on the lower surface side. The bonding layer of the first substrate 112 can be used, for example, for bonding the electronic element mounting substrate 1 and a conductor layer positioned in the wiring board or the electronic element housing package. The bonding layer can be manufactured by the same method as the metal layer 13 described above. The metal layer 13 of the first substrate 112 is disposed substantially on the entire lower surface of the first substrate 112, so that good heat dissipation from the electronic element mounting substrate 1 to the wiring board or the electronic element housing package is achieved.

The electronic element mounting substrate 1 according to the second embodiment can be manufactured by, for example, the following manufacturing method.

Figure 9A:
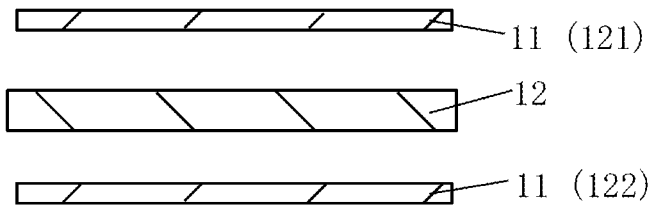
FIGS. 9A to 9C illustrate sectional views illustrating a method for manufacturing the electronic element mounting substrate of the second embodiment.
Figure 9B:
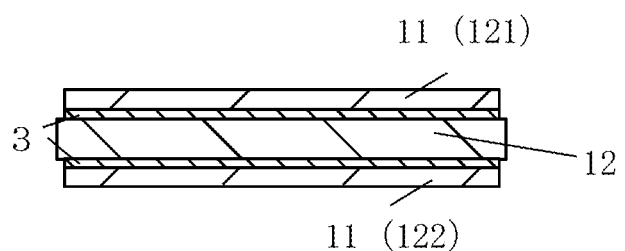
Figure 9C:
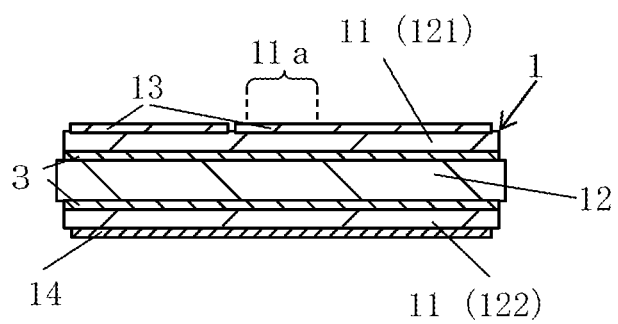
Figure 9C:
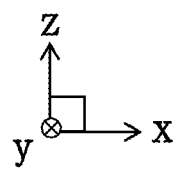
Figure 10A:
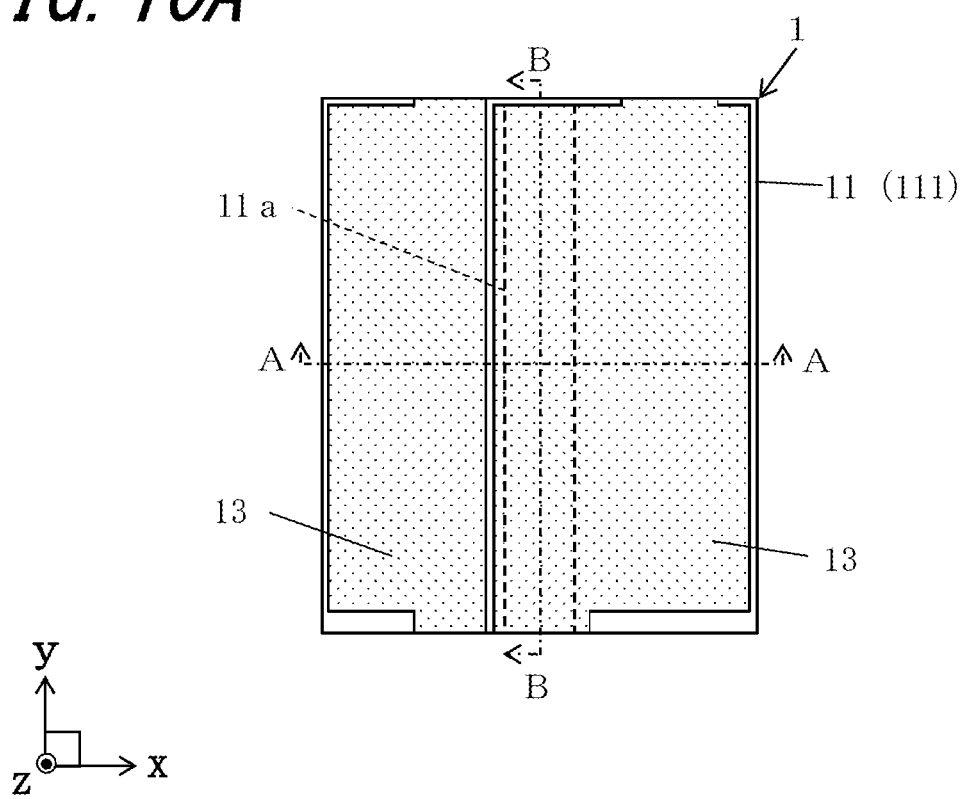
FIG. 10A is a top view illustrating an electronic element mounting substrate according to a third embodiment and FIG. 10B is a bottom view of FIG. 10A.
Figure 10B:
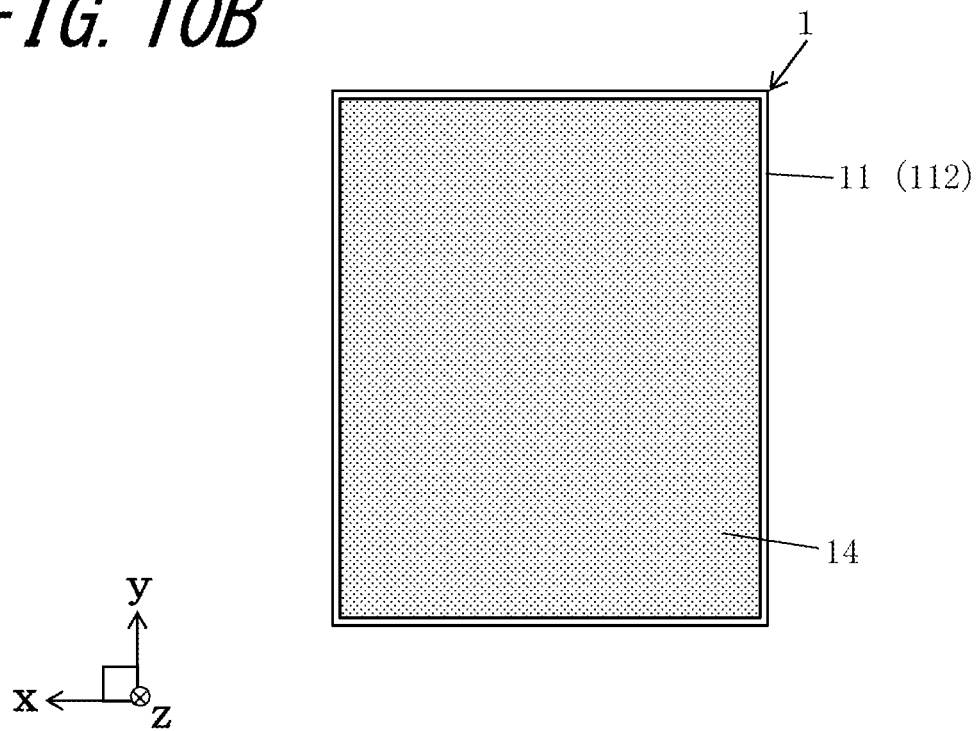

First, as illustrated in FIG. 9A, the first substrates 11 (111, 112) and the second substrate 12 are prepared. Next, as in the example illustrated in FIG. 9B, the first substrate 111 and the second substrate 12, and the first substrate 112 and the substrate 12 are respectively bonded by the bonding material 3 such as an active brazing material of a TiCuAg alloy, thereby forming the composite substrate. The first substrate 111 and the second substrate 12 and the first substrate 112 and the substrate 12 may be bonded simultaneously. The thickness of the bonding material 3 is about 10 μm. Next, the metal layer 13 is formed on the first main surface of the first substrate 11. The metal layer 13 is formed so that the X direction (thermal conductivity λx>>thermal conductivity λy) of the second substrate 12 in the composite substrate is perpendicular to the longitudinal direction of the mounting portion 11a, thereby forming the electronic element mounting substrate 1 as in the example illustrated in FIG. 9C.

When forming the thin film layer to be the metal layer 13 on the first main surface of the first substrate 11 and forming the plating layer on the thin film layer, if a protective film such as a resin, ceramic, or metal film is disposed in advance on the exposed side surface of the second substrate 12, the second substrate 12 formed of a carbon material is not exposed when the electronic element mounting substrate 1 is manufactured. Therefore, it is possible to reduce deterioration due to chemicals or the like.

The electronic element mounting substrate 1 of the second embodiment can be manufactured using the same manufacturing method as the electronic element mounting substrate 1 of the above embodiment.

Similarly to the electronic element mounting substrate 1 of the first embodiment, if the electronic element mounting substrate 1 of the second embodiment has a rectangular shape in which a long side corresponding to the longitudinal direction of the electronic element 2 extends in plan view along the rectangular electronic element 2, the width of the electronic element mounting substrate 1 in the direction perpendicular to the longitudinal direction of the electronic element 2 is shortened, and heat dissipated in directions different from the longitudinal direction of the electronic element 2 can be easily dissipated to the outside.

Similarly to the electronic element mounting substrate 1 of the first embodiment, in the electronic element mounting substrate 1 of the second embodiment, the first main surface and the second main surface of the first substrate 11 (111) may be planarized by surface processing such as polishing. The adhesion between the first substrate 11 (111) and the second substrate 12 can be improved, and the metal layer can be appropriately formed on the first main surface of the first substrate 11 (111). The heat of the first substrate 11 can be appropriately dissipated to the second substrate 12.

The first main surface and the second main surface of first substrate 11 (112) may be planarized by surface processing such as polishing. In this manner, the adhesion between the first substrate 11 (112) and the second substrate 12 can be improved, and the adhesion between the first substrate 11 (112) and the wiring board or the electronic element housing package can be improved.

Third Embodiment

Next, an electronic device according to a third embodiment will be described with reference to FIGS. 10A to 13C.

The electronic element mounting substrate 1 according to the third embodiment differs from the electronic element mounting substrate 1 according to the above embodiments in that a plurality of second substrates 12 (121, 122, 123) is stacked between two first substrates 11. In the plurality of second substrates 12 (121, 122, 123), adjacent second substrates 12 (121 and 122, 122 and 123) are disposed to have the thermal conductivities $\lambda$ in the plane direction different from each other. The metal layer 13 and the bonding layer 14 are indicated by hatching in the example illustrated in FIGS. 10A and 10B.

According to the electronic element mounting substrate 1 in the third embodiment, similarly to the electronic element mounting substrate 1 of the above embodiments, heat dissipation is facilitated in directions different from the expansion direction of the electronic element 2 in the longitudinal direction, and thus the expansion of the electronic element 2 in the longitudinal direction is reduced, the positional deviation of the electronic element 2 or distortion of the electronic element mounting substrate 1 is suppressed, and light can be appropriately emitted easily.

Since a plurality of second substrates 12 having different thermal conductivities $\lambda$ in the plane direction is stacked between the two first substrates 11, the distortion of the electronic element mounting substrate 1 is suppressed, positional deviation of the electronic element 2 or distortion of the electronic element mounting substrate 1 is suppressed, and the light can be appropriately emitted easily.

In the electronic element mounting substrate 1 of the third embodiment, the second main surface of the first substrate 111 and the third main surface of the second substrate 121, and the second main surface of the first substrate 112 and the fourth main surface of the second substrate 123 are bonded by the bonding material 3 such as an active brazing material of a TiCuAg alloy.

Similarly to the first embodiment, also in the electronic element mounting substrate 1 of the third embodiment, the first substrate 11 and the second substrate 12 each have a square shape in plan view. By bonding the square shaped first substrate and the square shaped second substrate 12, a square shaped composite substrate is formed. The square shape is a quadrangle such as a square or a rectangular shape. In the example illustrated in FIGS. 10A to 13C, the first substrate 11 and the second substrate 12 have a rectangular shape, and a rectangular composite substrate is formed.

Similarly to the electronic element mounting substrate 1 of the first embodiment, also in the electronic element mounting substrate 1 of the third embodiment, the first substrate 11 (111, 112) and the second substrate 12 (121, 122, 123) each have a square shape in plan view. By bonding the square shaped first substrate 11 and the square shaped second substrate 12, a square shaped composite substrate is formed. The square shape is a quadrangle such as a square or a rectangular shape. In the example illustrated in FIGS. 10A to 13C, the first substrate 11 (111, 112) and the second substrate 12 (121, 122, 123) have a rectangular shape, and a rectangular composite substrate is formed.

Similarly to the electronic element mounting substrate 1 of the first embodiment, the substrate thickness T1 of the first substrate 11 (111, 112) is, for example, about 50 μm to 500 μm, and similarly to the electronic element mounting substrate 1 of the first embodiment, the substrate thickness T2 of the second substrate 12 (121, 122, 123) is, for example, about 100 μm to 2000 μm. When T2>T1, the first substrates 11 (111, 112) and the second substrate 12 (121, 122, 123) can appropriately dissipate a heat of the first substrate 111 to the second substrate 12.

Similarly to the electronic element mounting substrate 1 of the first embodiment, a thermal conductivity $\kappa$ of the first substrate 11 (111, 112) is substantially constant in the X direction and Y direction in the plane direction of each substrate, and a thermal conductivity $\kappa$ in the Z direction of the first substrate 11 (111, 112) in the thickness direction is also equivalent to that in the X direction and the Y direction in the plain direction (kx≈ky≈kz). For example, when an aluminum nitride sintered body is used as the first substrate 11 (111, 112), a substrate having the thermal conductivity $\kappa$ of about 100 to 200 W/m·K is used as the first substrate 11 (111, 112).

The thermal conductivity $\lambda$ of the second substrate 12 (211, 212, 213) is different in magnitude between the X direction and the Y direction in the plane direction. The thermal conductivity $\lambda$ of each of the plurality of second substrates 12 (211, 212, 213) is as follows, for example, as in the example illustrated in FIG. 11.

Second substrate 121 (on an upper surface side): Thermal conductivity $\lambda x1 \approx$ Thermal conductivity $\lambda z1 \gg$ Thermal conductivity $\lambda y1$ Second substrate 122 (intermediate): Thermal conductivity $\lambda y2 \approx$ Thermal conductivity $\lambda z2 \gg$ Thermal conductivity $\lambda x2$ Second substrate 123 (on a lower surface side): Thermal conductivity $\lambda x3 \approx$ Thermal conductivity $\lambda z3 \gg$ Thermal conductivity $\lambda y3$ The thermal conductivity $\lambda$ of the second substrate 121 and the second substrate 123 is equal in the X direction in the plane direction and in the Z direction in the thickness direction, and the thermal conductivity λ in the Y direction in the plane direction is different. The thermal conductivity λ of the second substrate 122 is the same in the Y direction in the plane direction and in the Z direction in the thickness direction, and the thermal conductivity λ in the X direction in the plane direction is different. For example, the thermal conductivity λx1 and the thermal conductivity λz1 of the second substrate 121 are about 1000 W/m·K, and the thermal conductivity λy1 of the second substrate 12 is about 4 W/m·K. The thermal conductivity λy2 and the thermal conductivity λz2 of the second substrate 122 are approximately 1000 W/m·K, and the thermal conductivity λx2 of the second substrate 12 is approximately 4 W/m·K. The thermal conductivity λx3 and the thermal conductivity λz3 of the second substrate 123 are about 1000 W/m·K, and the thermal conductivity λy3 of the second substrate 123 is about 4 W/m·K.

The third main surface of the second substrate 121 is adhered to the second main surface of the first substrate 111 such that the thermal conduction in the direction perpendicular to the longitudinal direction of the mounting portion 11a is greater than the thermal conduction of the mounting portion 11a disposed on the first main surface of the first substrate 111 in the longitudinal direction.

Figure 11:
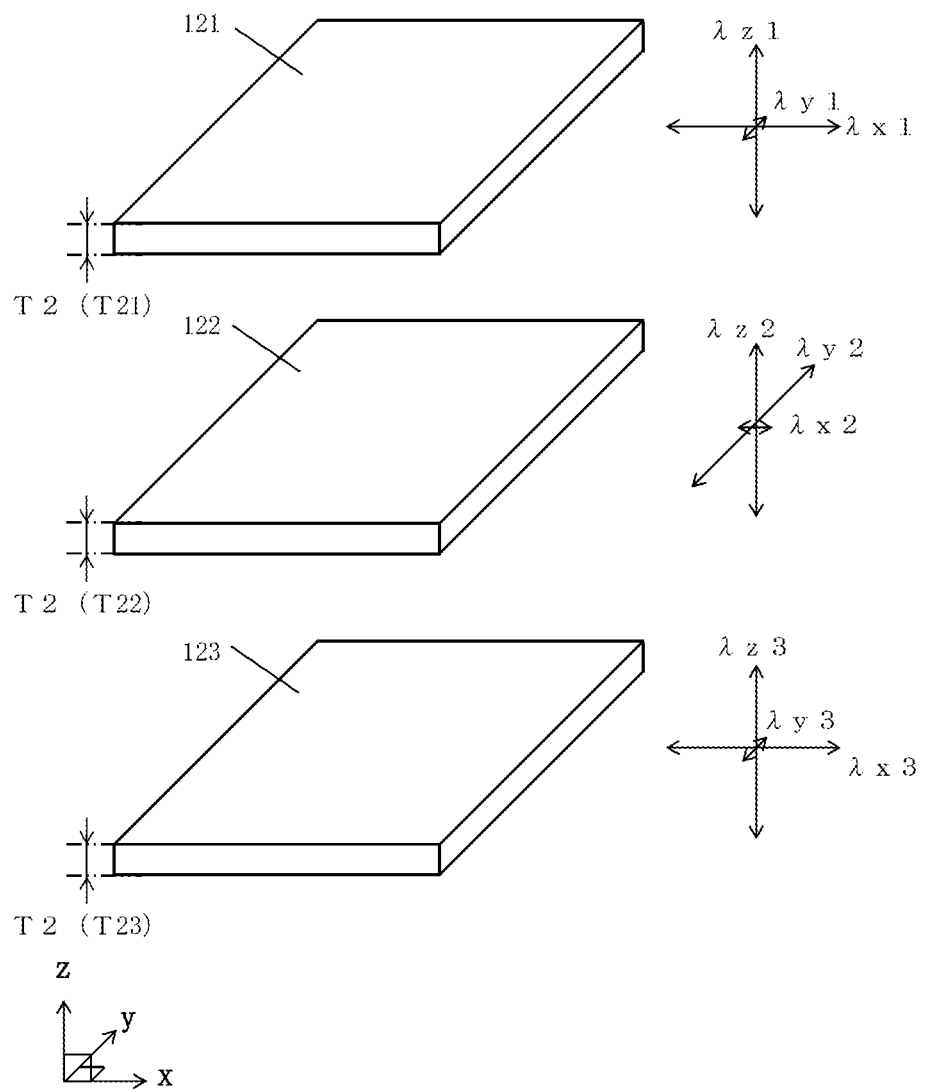
FIG. 11 is an exploded perspective view of a plurality of second substrates of the electronic element mounting substrate illustrated in FIGS. 10A and 10B.
Figure 12A:
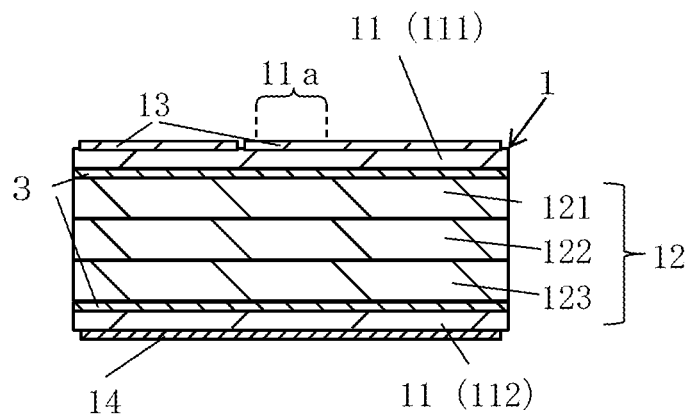
FIG. 12A is a longitudinal sectional view taken along line A-A of the electronic element mounting substrate illustrated in FIG. 10A
Figure 12A:
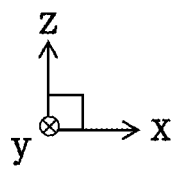
Figure 12B:
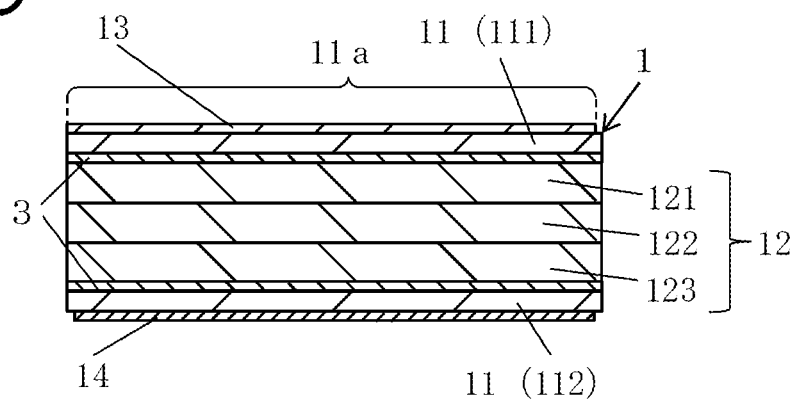
FIG. 12B is a longitudinal sectional view taken along line B-B of the electronic element mounting substrate illustrated in FIG. 10A.
Figure 12B:
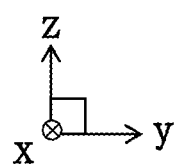

As in the example illustrated in FIG. 11, the thermal conductivities λ of the adjacent second substrates 12 (the second substrate 121 and the second substrate 122, or the second substrate 122 and the second substrate 123) are rotated by at least 90 degrees in plan view, and the directions in which the thermal conductivity of the adjacent second substrates 12 (the second substrate 121 and the second substrate 122, or the second substrate 122 and the second substrate 123) increases may be perpendicular to each other. Accordingly, since the heat transfer from the second substrate 123 to the first substrate 122 can be dissipated as the whole surface, the expansion of the electronic element 2 in the longitudinal direction is reduced, the positional deviation of the electronic element 2 or the distortion of the electronic element mounting substrate 1 is suppressed, and light can be appropriately emitted easily.

Similarly to the electronic element mounting substrate 1 of the second embodiment, the substrates of the same material may be used as the two first substrates 11 (111, 112) bonded to the third main surface of the second substrate 121 and the fourth main surface of the second substrate 123. For example, when the first substrate 111 is an aluminum nitride sintered body having a thermal conductivity of 150 W/m·K, the first substrate 112 may be an aluminum nitride sintered body having a thermal conductivity of 150 W/m·K. By setting the material of the first substrate 111 bonded to the third main surface of the second substrate 121 and the material of the first substrate 112 bonded to the fourth main surface of the second substrate 123 to same as each other, distortion of the electronic element mounting substrate 1 can be appropriately reduced.

Similarly to the electronic element mounting substrate 1 of the second embodiment, the two first substrates 11 (111, 112) bonded to the third main surface of the second substrate 12 and the fourth main surface of the second substrate 123 may have a difference in thickness of 10% or less or may be a substrate of the same thickness. For example, when the thickness of the first substrate 111 is 100 μm, the thickness of the first substrate 112 may be 100 μm or may be 90 μm to 110 μm. By setting the thickness of the first substrate 111 bonded to the third main surface of the second substrate 121 and the thickness of the first substrate 112 bonded to the fourth main surface of the second substrate 123 to equal to each other, distortion of the electronic element mounting substrate 1 can be appropriately reduced.

The plurality of second substrates 12 (121, 122, 123) disposed between the two first substrates 11 (111, 112) may have a difference in thickness of 10% or less ($0.9T22 \leq T21 \leq 1.1T22$ and $0.9T23 \leq T21 \leq 1.1T23$), and may be substrates having the same thickness ($T21=T22=T23$). For example, when the thickness of the second substrate 121 is 1000 μm, the thickness of the second substrate 122 may be 1000 μm or may be 900 μm to 1100 μm. The thickness of the second substrate 123 may be 1000 μm, or may be 900 μm to 1100 μm. By setting the thickness of each of the plurality of second substrates 12 (121, 122, 123) to equal, distortion of the electronic element mounting substrate 1 can be appropriately reduced.

As in the example illustrated in FIGS. 10A to 13C, in the first substrate 112 bonded to the fourth main surface, the bonding layer may be positioned on the lower surface side. The bonding layer of the first substrate 112 can be used, for example, for bonding the electronic element mounting substrate 1 and a conductor layer positioned in the wiring board or the electronic element housing package. The bonding layer can be manufactured by the same method as the metal layer 13 described above. The metal layer 13 of the first substrate 112 is disposed substantially on the entire lower surface of the first substrate 112, so that good heat dissipation from the electronic element mounting substrate 1 to the wiring board or the electronic element housing package is achieved.

The electronic element mounting substrate 1 according to the third embodiment can be manufactured by, for example, the following manufacturing method.

First, as illustrated in FIG. 13A, the first substrates (111, 112) and a plurality of second substrates 12 (121, 122, 123) are prepared. In the plurality of second substrates 12, the adjacent second substrates 12 are disposed such that the thermal conductivities λ in the respective plane directions are different from each other. Next, as in the example illustrated in FIG. 13B, the first substrate 111 and the second substrate 12 (121, 122, 123), and the first substrate 112 and the substrate 12 (121, 122, 123) are respectively bonded by the bonding material 3 such as an active brazing material of a TiCuAg alloy. The first substrate 111 and the second substrate 12 (121, 122, 123) and the first substrate 112 and the substrate 12 (121, 122, 123) may be bonded simultaneously. The thickness of the bonding material 3 is about 10 μm. Next, the metal layer 13 is formed on the first main surface of the first substrate 11. The metal layer 13 is formed so that the X direction (thermal conductivity λx>>thermal conductivity λy) of the second substrate 121 in the composite substrate is perpendicular to the longitudinal direction of the mounting portion 11a, thereby forming the electronic element mounting substrate 1 as in the example illustrated in FIG. 13C.

For example, an aluminum nitride sintered body having a thickness of 0.15 mm and a thermal conductivity of 170 W/m·K is used as the first substrate 11 (111, 112), a structure in which graphene each having a thickness of 1 mm is stacked is used as the second substrate 12 (121, 122, 123) to prepare the electronic element mounting substrate 1 having a total thickness of 3.3 mm, a square shape in plan view and a size of 10 mm in length and width. When the thermal conductivity of the electronic element mounting substrate 1 was measured by the above laser flash method, the thermal conductivity of the electronic element mounting substrate 1 in the third embodiment was 650 W/m·K.

When forming the thin film layer to be the metal layer 13 on the first main surface of the first substrate 11 and forming the plating layer on the thin film layer, if a protective film of a resin, ceramic, or metal film is disposed in advance on the exposed side surface of the second substrate 12, the second substrate 12 of a carbon material is not exposed when the electronic element mounting substrate 1 is manufactured. Therefore, it is possible to reduce deterioration due to chemicals or the like.

The electronic element mounting substrate 1 of the third embodiment can be manufactured using the same manufacturing method as the electronic element mounting substrate 1 of the above embodiments.

Similarly to the electronic element mounting substrate 1 of the first embodiment, when the electronic element mounting substrate 1 of the third embodiment has a rectangular shape in which a long side corresponding to the longitudinal direction of the electronic element 2 extends in plan view along the rectangular electronic element 2, the width of the electronic element mounting substrate 1 in the direction perpendicular to the longitudinal direction of the electronic element 2 is shortened, and heat dissipated in directions different from the longitudinal direction of the electronic element 2 can be easily dissipated to the outside.

Similarly to the electronic element mounting substrate 1 of the first embodiment and the electronic element mounting substrate 1 of the second embodiment, the electronic element mounting substrate 1 of the third embodiment may be planarized by surface processing such as polishing processing on the first main surface and the second main surface of the first substrate (111, 112).

The present disclosure is not limited to the examples of the embodiments described above and various modifications are possible. For example, the shape may be a square having a notch or a chamfer at a corner of a composite substrate in which the first substrate 11 and the second substrate 12 are bonded to each other.

The metal layer 13 positioned on the first main surface of the first substrate 11 is formed by the thin film method in the above example. However, the metal layer 13 may be a metal layer using a conventionally well-known co-firing method or post-firing method. When such a metal layer 13 is used, the metal layer 13 is disposed on the first main surface of the first substrate 11 in advance before the bonding of the first substrate 11 and the second substrate 12. In order to have a good flatness of the first substrate 11, as described in the above first embodiment, the metal layer 13 positioned on the first main surface of the first substrate 11 may be formed by a thin film method.

The invention claimed is:

1. An electronic element mounting substrate, the substrate comprising:
  a first substrate comprising a first main surface and a second main surface opposite to the first main surface; and
  a plurality of second substrates each comprising a third main surface and a fourth main surface opposite to the third main surface,
  the first substrate comprising a mounting portion for mounting an electronic element, positioned on the first main surface,
  the mounting portion having a rectangular shape,
  one end portion of the mounting portion in a longitudinal direction being positioned at an outer edge portion of the first main surface,
  the plurality of second substrates being formed of a carbon material,
  the third main face of the second substrate which is positioned closest to the first substrate facing the second main surface,
  the plurality of second substrates are stacked in a thickness direction of the first substrate, wherein
    a thermal conduction of the mounting portion in a direction perpendicular to the longitudinal direction is greater than a thermal conduction of the mounting portion in the longitudinal direction, in the third main surface of the second substrate which is positioned closest to the first substrate, in plan view,
    two adjacent second substrates of the plurality of second substrates are so configured that a direction in which a thermal conductivity of one of the two adjacent second substrates increases and a direction in which a thermal conductivity of the other of the two adjacent second substrates increases are perpendicular to each other in plan view, and
    each of the plurality of second substrates comprises a first side surface on a side where the one end portion is located in plan view, and is so configured that a thermal conduction in the first side surface in a thickness direction is greater than a thermal conduction in a direction perpendicular to the thickness direction.

2. The electronic element mounting substrate according to claim 1, wherein
  each of the plurality of second substrates comprises a second side surface opposite to the first side surface, and is so configured that a thermal conduction in the second side surface in the thickness direction is greater than a thermal conduction in the direction perpendicular to the thickness direction.

3. An electronic device, comprising:
  the electronic element mounting substrate according to claim 2;
  an electronic element mounted on the mounting portion of the electronic element mounting substrate; and
  a wiring board or an electronic element housing package on which the electronic element mounting substrate is mounted.

4. An electronic module, comprising:
  the electronic device according to claim 3; and
  a module substrate connected with the electronic device.

5. An electronic device, comprising:
  an electronic element mounting substrate including
    a first substrate comprising a first main surface and a second main surface opposite to the first main surface; and
    a plurality of second substrates each comprising a third main surface and a fourth main surface opposite to the third main surface,
    the first substrate comprising a mounting portion for mounting an electronic element, positioned on the first main surface,
    the mounting portion having a rectangular shape,
    one end portion of the mounting portion in a longitudinal direction being positioned at an outer edge portion of the first main surface,
    the plurality of second substrates being formed of a carbon material,
    the third main face of the second substrate which is positioned closest to the first substrate facing the second main surface,
    the plurality of second substrates are stacked in a thickness direction of the first substrate, wherein a thermal conduction of the mounting portion in a direction perpendicular to the longitudinal direction is greater than a thermal conduction of the mounting portion in the longitudinal direction, in the third main surface of the second substrate which is positioned closest to the first substrate, in plan view, two adjacent second substrates of the plurality of second substrates are so configured that a direction in which a thermal conductivity of one of the two adjacent second substrates increases and a direction in which a thermal conductivity of the other of the two adjacent second substrates increases are perpendicular to each other in plan view, and each of the plurality of second substrates comprises a first side surface on a side where the one end portion is located in plan view, and is so configured that a thermal conduction in the first side surface in a thickness direction is greater than a thermal conduction in a direction perpendicular to the thickness direction;

an electronic element mounted on the mounting portion of the electronic element mounting substrate; and a wiring board or an electronic element housing package on which the electronic element mounting substrate is mounted.

6. An electronic module, comprising:

the electronic device according to claim 5; and a module substrate connected with the electronic device.

\* \* \* \* \*